United States Patent
Kim et al.

[19]

[11] Patent Number: 6,163,508
[45] Date of Patent: Dec. 19, 2000

[54] RECORDING METHOD HAVING TEMPORARY BUFFERING

[75] Inventors: Seung Kil Kim, Chapel Hill; Nils R. C. Rydbeck, Cary, both of N.C.

[73] Assignee: Ericsson Inc., Research Triangle Park, N.C.

[21] Appl. No.: 09/311,485

[22] Filed: May 13, 1999

[51] Int. Cl.[7] .............................. H04H 9/00; G11B 19/00
[52] U.S. Cl. ................................................. 369/7; 369/25
[58] Field of Search .............................. 369/7, 6, 25, 27, 369/29; 379/68, 75, 67.1

[56] References Cited

U.S. PATENT DOCUMENTS

| | | | |
|---|---|---|---|
| 5,111,500 | 5/1992 | Afshar et al. | 379/67 |
| 5,235,571 | 8/1993 | Ellermeier | 369/25 |
| 5,282,092 | 1/1994 | Wilhelms . | |
| 5,371,551 | 12/1994 | Logan et al. . | |
| 5,491,774 | 2/1996 | Norris et al. . | |
| 5,526,407 | 6/1996 | Russell et al. . | |
| 5,633,837 | 5/1997 | Gantt | 369/7 |
| 5,740,543 | 4/1998 | Maeda | 455/550 |
| 5,867,793 | 2/1999 | Davis | 455/556 |
| 6,038,199 | 3/2000 | Pawlowski et al. | 369/25 |

FOREIGN PATENT DOCUMENTS

| | | |
|---|---|---|
| 0 529 374 A1 | 8/1992 | European Pat. Off. . |
| 0786774A2 | 1/1997 | European Pat. Off. . |
| 0957489A1 | 11/1998 | European Pat. Off. . |
| WO 99/21185 | 4/1999 | WIPO . |

*Primary Examiner*—Tan Dinh
*Attorney, Agent, or Firm*—Coats & Bennett, PLLC

[57] ABSTRACT

The initial portion of an audio work received from an audio source is temporarily buffered so as to allow a user to make a recording of an audio work, including the initial portion of the audio work, even when the decision to record is made after the audio work has begun. In one embodiment, the incoming data stream representing the audio work is monitored for the presence of a sound gap, indicating the beginning of a new audio work. A DSP compresses the data, preferably according to perceptual coding technique such as MPEG-3 or Windows Media Technology 4.0, and forwards the compressed data to a short term memory buffer, such as a simple FIFO buffer, for temporary storage. If the user initiates a recording procedure before buffer is filled, a central controller pulls the compressed data from the buffer and transfers it to long term memory. If the user fails to act before the buffer fills, the buffer is flushed, and the process prepares for the next audio work. Thus, before recording begins, the data in the buffer includes at least the initial portion of the audio work. This method is particularly adapted for use in small hand-held devices, such as a combined cellular telephone with digital recording, and car radios, and the like.

18 Claims, 3 Drawing Sheets

RECORDING METHOD HAVING TEMPORARY BUFFERING

FIELD OF THE INVENTION

The present invention relates to a method of recording an audio work that allows the decision to record to be made after the audio work has already begun without sacrificing the initial portion of the audio work.

BACKGROUND OF THE INVENTION

Users frequently listen to broadcast and/or pre-recorded music, inspirational speeches, news broadcasts, and the like while performing other tasks. For instance, many people listen to radio music while driving. Frequently, such users may desire to record what they are hearing for later listening, such as when they can devote their entire attention to listening, or just to compile a collection of favorite works. However, such users are typically frustrated in their recording efforts because they do not realize that they want to record the currently playing audio work until after the audio work has already started. For instance, a user may only decide to record a song after several seconds, or even minutes, of play. If recording begins at that time, the recording will be missing the initial portion of the song, even if the recording process is instantaneous after the decision to record is made. Thus, the user will be unable to listen to the entire audio work at a later time. Of course, it is theoretically possible to record the entire audio work with present technology, but only if the user knows when the work is going to be played and can plan ahead enough to begin recording before the work starts playing. In the real world, this is impractical.

Thus, there is a need for method of recording audio works that allows the user to record an audio work from the beginning of the work even when the decision to record is made after some initial portion of the audio work has already been played.

SUMMARY OF THE INVENTION

The present invention temporarily buffers the initial portion of an audio work received from an audio source so as to allow a user to make a recording of an audio work, including the initial portion of the audio work, even when the decision to record is made after the audio work has been at least partially played.

In one embodiment of a circuit for implementing the present method, the audio work is input to a digital signal processor (DSP), after optional amplification and conversion from analog form where appropriate. When the beginning of an audio work is detected, the DSP checks the incoming data stream for a sound gap, indicating the beginning of a new audio work. The DSP compresses the data, preferably according to perceptual coding technique such as MPEG-3 or Windows Media Technology 4.0, and forwards the compressed data to a short term memory buffer for temporary storage. The short term memory butter is preferably a simple FIFO buffer of sufficient size to temporarily store between approximately twenty seconds and one minute of the audio work. If the user initiates a recording procedure before the buffer fills, the compressed data is pulled from the buffer and transferred to long term memory, such as flash memory or battery assisted DRAM. If the user does not initiate the recording procedure before the temporary storage buffer is filled by the compressed incoming audio work data, the recording opportunity is lost and the buffer is flushed in order to prepare for the next candidate audio work. Thus, the buffer is used to store the initial portion of the audio work until the user chooses to record the presently playing audio work, or the buffer fills, whichever occurs first.

Importantly, before recording begins, the data in the buffer includes at least the initial portion of the audio work. That is, for a song, the data stored in the buffer represents at least the initial portion of the song. Thus, the initial portion of the song is available for recording, if the user so decides.

This method is particularly adapted for use in small hand-held devices, such as a combined cellular telephone with digital recording, and car radios, and the like. The use of perceptual coding techniques allows for smaller amounts of memory to be used, while the automatic detection of the start of an audio work allows for automatic buffer management to occur.

DETAILED DESCRIPTION

The present invention relies on a temporary buffering approach that allows a user to make a recording of an audio work, including the initial portion of the audio work, even when the decision to record is made after the audio work has begun. Any type of audio work may be recorded, including songs, speeches, news broadcasts, dramatic readings, and the like. It is anticipated that these audio works will be received at the recording device from an audio source. Examples of audio sources include radio receivers, compact disc players, a microphone, a cellular phone, and the like. These audio sources may form a portion of the recording device, but the invention is more easily illustrated by considering the audio source 10 as separate from the recording device 20. The audio source 10 preferably provides the recording device 20 with an electrical input signal, corresponding to the audio work, in analog form, such as from a common microphone.

Figure 1:
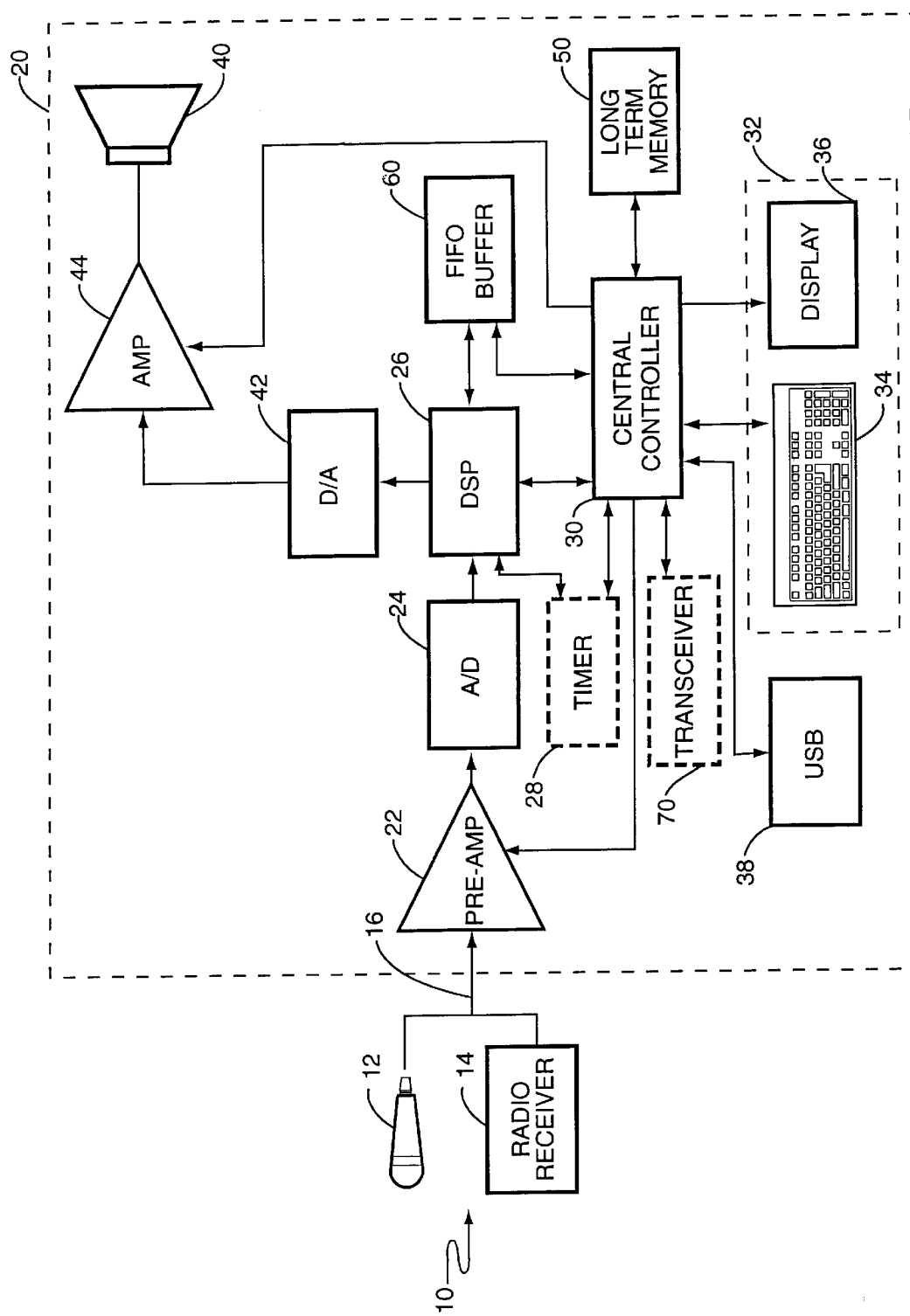
FIG. 1 is a schematic of one embodiment of a recording device according to the present invention.

One embodiment of a suitable recording device 20 is shown in FIG. 1. Input to the recording device 20 is received via one or more input lines 16. FIG. 1 shows illustrative inputs as being from a microphone 12 or from a radio receiver 14. The input line 16 connects to a digital signal processor (DSP) 26 via an analog to digital (A/D) converter 24 and an optional variable gain pre-amplifier 22. The DSP 26 receives audio signals from the input line 16 and processes those signals as will be discussed in more detail below. The DSP 26 operates semi-autonomously but also communicates with, and operates under the direction of, a central controller 30. In addition, the DSP 26 preferably outputs audio signals to a speaker 40 via a digital to analog (D/A) converter 42 and an optional variable gain amplifier 44. Further, the DSP 26 communicates with short term memory buffer 60, which preferably takes the form of a bi-directional FIFO buffer 60.

The central controller 30 oversees the general operation of the recording device 20 and typically takes the form of a common microprocessor. For instance, the central controller 30 helps control the gain provided by the variable gain amplifiers 22, 44. The central controller 30 also interfaces with a user interface 32 that typically includes a multi-key keypad 34 and display 36, such as a LCD. Any known user interface 32 may be used, and the particular details of the user interface 32 are unimportant for understanding the present invention. Likewise, the central controller 30 preferably also communicates with other common interfaces, such as an USB interface 38 and the like, in a manner well known in the art.

Also in communication with the central controller 30 is long term memory 50. The long term memory 50 may take a wide variety of forms, with the particular form being a matter of design choice. For instance, the long term memory 50 may be a floppy disk drive, a hard disk drive, flash memory, DRAM, or the like. The long term memory 50 may be either volatile or non-volatile and preferably has suitable battery power back-up if volatile.

In operation, the recording device 20 receives the start of an audio work from the audio source 10 via the input line 16. This input is typically in analog form, and therefore typically needs to be converted into digital form for processing by the DSP 26. To do so, the audio signals are fed to the A/D converter 24. In order to get high quality recording of music, usually fourteen to sixteen bits of dynamic range are required. As such, the optional variable gain pre-amplifier 22 may be used to adjust the gain of the input to the A/D converter 24 so as to not over-load the A/D converter 24, and the DSP 26 operates in an Automatic Gain Control mode well known in the art. On the output side, the DSP 26 outputs the audio signal to the speaker 40, via the D/A converter 42 and a variable gain amplifier 44 in a manner well known in the art. This output from the DSP 26 to the speaker 40 preferably occurs regardless of any recording functions that the DSP 26 may or may not be actively involved with concurrently.

In addition, the DSP 26 analyzes the incoming audio signal. When the DSP 26 detects a gap in the incoming audio signal, the DSP 26 initializes a temporary buffering procedure. The DSP 26 notifies the central controller 30 that a new audio work has been detected and begins sending encoded data to the short term memory 60. Encoding is used to compress the audio signal so as to require a smaller amount of memory space to store. The compression routine applied by the DSP 26 is preferably a perceptual coding technique that addresses the perception of sound waves by the human ear. One example of such a perceptual coding technique is by using MPEG layer 3 audio coding ("MPEG-3"). The details of MPEG-3 coding are set forth in international standards IS-11172-3 and 13813-3 which are incorporated herein by reference. Of course, other perceptual coding techniques may be used, such as Windows Media Technology 4.0, or any other known technique. Preferably, the audio signal is compressed by a factor of at least twelve, but may be compressed by a factor of twenty-four or more. This encoding for compression is called stream compression because the signal is compressed and output by the DSP 26 concurrently with the receipt of later data for the same audio work, as compared with compressing the audio signal only after the receipt of the entire audio work.

The compressed audio signal is fed to the short term memory buffer 60. The compressed audio signal from the DSP 26 is preferably stored in the buffer 60 until the buffer 60 is either read by the central controller 30 or is flushed in response to a command from the DSP 26 and/or the central controller 30. The buffer 60 should be large enough to store at least the initial portion of the audio work. Preferably, this is at least twenty seconds, but it may be shorter or longer. The purpose of the buffer 60 is to allow the user an appreciable amount of time to decide whether the audio work should be recorded or not. While it is within the scope of the present invention, it is unlikely that the buffer 60 would be large enough to hold more than about one minute worth of compressed data.

Importantly, the data initially stored in the buffer 60 represents at least the initial portion of the audio work. That is, for a song, the data stored in the buffer 60 represents at least the initial portion of the song. Thus, the initial portion of the song is available for recording, if the user so decides.

The process flow of the present invention may be most easily illustrated by focusing on the recording of musical audio works that are separated by sound gaps. Such sound gaps typically take the form of silences of one second or more in duration. However, it is not uncommon for there to be no suitably long silence between audio works. For instance, it is well known that radio disc jockeys frequently begin talking before the end of one song and continue into the beginning of the next. In such situations, and for purposes of illustration herein, such periods of voice without music are treated as sound gaps.

Figure 2:
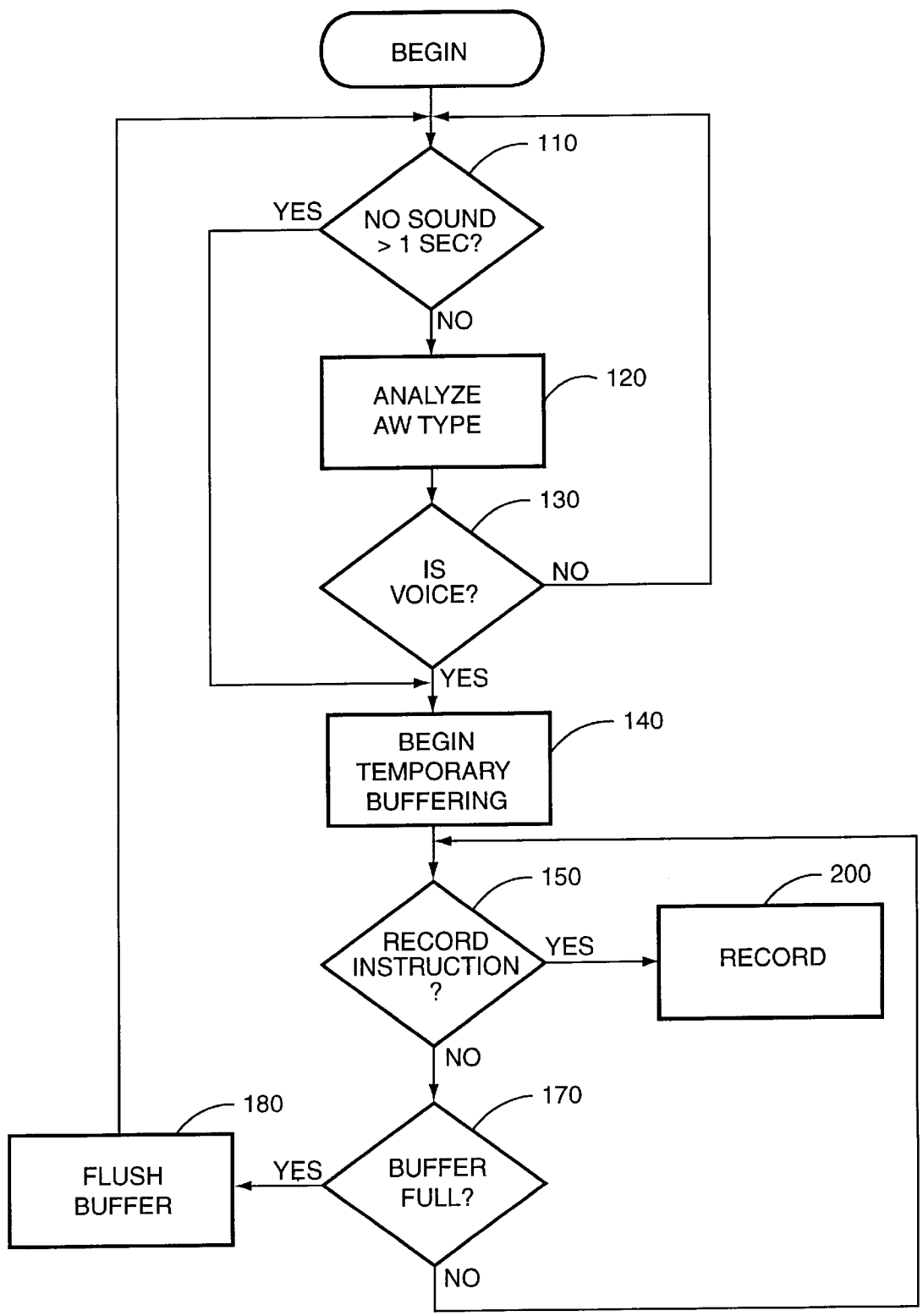
FIG. 2 is a simplified flow chart showing the overall temporary buffering operation of one embodiment of the recording device.

A flow chart of the overall actions of one embodiment of the recording device 20 is shown in FIG. 2. The process begins by the DSP 26 examining the incoming audio signal, looking for an instance of a signal corresponding to no sound that lasts for at least a specified minimum period of time (box 110). For purposes of illustration, this minimum time is shown as one second, but a longer or shorter period may be used. The time selected should be sufficient to distinguish between audio works without being tripped by normal pauses within an audio work. If desirable, the sound gap time may be optionally set by the user. If a sound gap is detected, the temporary buffering procedure is initiated (box 140). If no sound gap is detected, then the audio work type is analyzed (box 120). For instance, DSP 26 may apply an analysis that looks at the frequency spectrum of the audio work and looks for spectrum content that is beyond the typical range for human voices. In addition, or alternatively, the DSP 26 may apply an analysis that looks at the frequency profile and looks for characteristics of the profile that match those typically found in music. If either of these conditions are met, then the audio signal is likely musical in nature. If not, then the audio signal is likely that of a human voice. If the audio signal is not a voice, meaning no "sound gap" has been detected, the process loops back to before box 110. If the audio signal is voice, then the process continues to box 140.

In box 140, the DSP 26 sends the encoded data, representing the incoming audio signal, to the buffer 60. This process continues until the earlier of the receipt of a "start recording" instruction (box 150) or the buffer 60 becomes full (box 170). To initiate recording session, the user may press an appropriate key on the keypad (e.g. "record" key) or otherwise notify the central controller 30 that a recording session should begin by any method known in the art. If a start-recording instruction has been received (box 150), the long-term recording process is initiated (box 200). If no start-recording instruction is received, the status of the buffer is checked (box 170). If the buffer 60 has exceeded its capacity, the very first portion of the audio work has been pushed out of the buffer 60 and therefore lost. Because the initial portion of the audio work is no longer available, the DSP 26 stops sending additional data to the buffer 60, the buffer 60 is flushed (box 180), and the process returns to waiting for the detection of a sound gap (box 110). If the buffer 60 has not been filled, then the DSP 26 continues sending encoded data to the buffer 60 and the process continues monitoring for either a record instruction (box 150) or the buffer 60 to become full (box 170) by looping back to before box 150.

Figure 3:
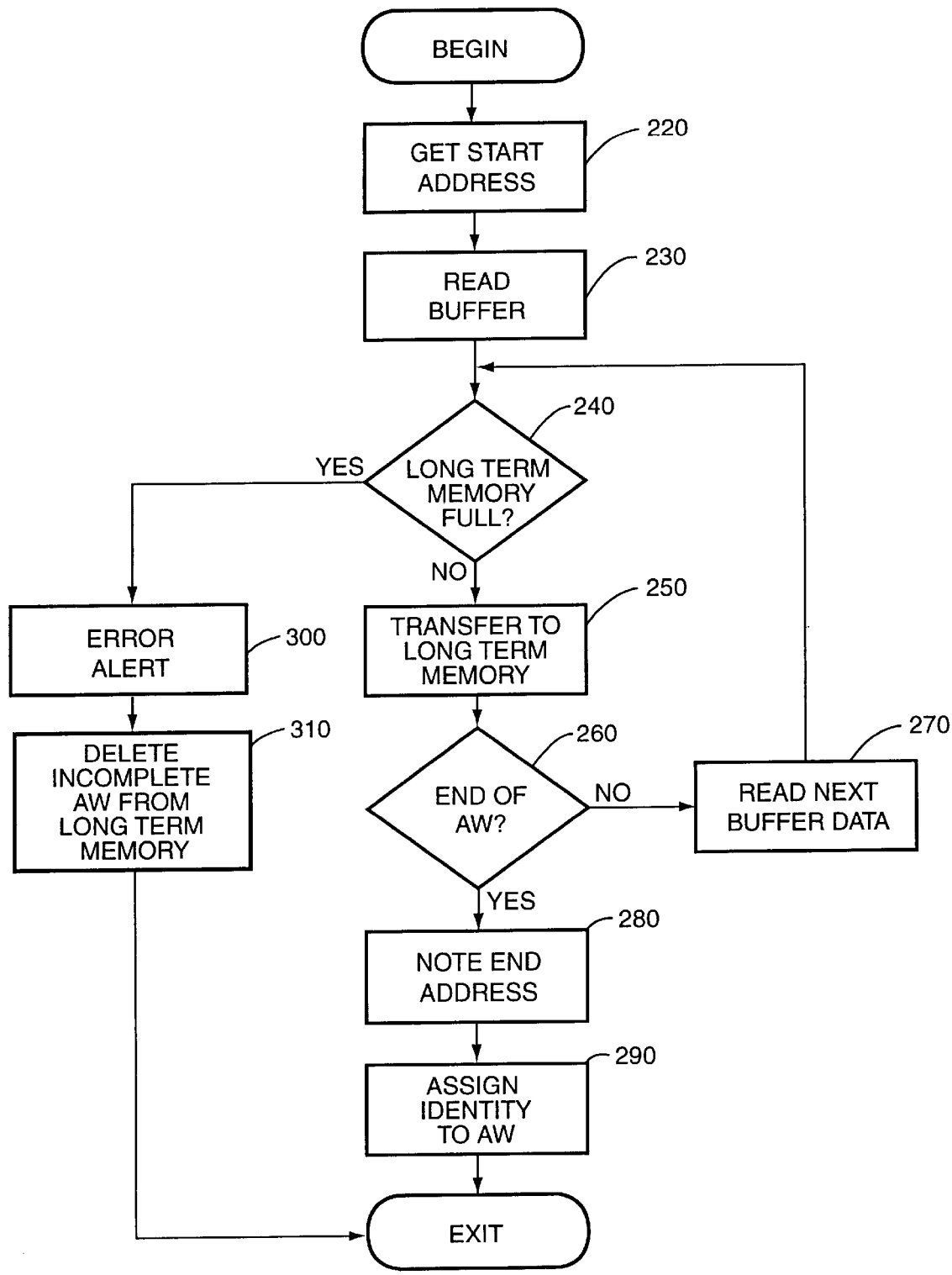
FIG. 3 is a flow chart showing the long-term recording sub-process represented in FIG. 2 by box 200 in greater detail.

A simple long term recording sub-process is shown in FIG. 3. The process begins by the central controller 30 selecting a suitable starting address in long term memory 50 (box 220). The central controller 30 reads the first set of data from the buffer 60 (box 230). If long term memory 50 is not full (box 240), the central controller 30 transfers the first set of data from the buffer 60 to long term memory 50 (box 250), starting at the starting address. The central controller 30 may optionally apply additional coding and/or decoding to the data from the buffer 60 before forwarding the data to the long term memory 50. While this is occurring, the DSP 26 continues sending encoded data to the buffer 60 and monitoring for a sound gap. When the DSP 26 notes the presence of a sound gap, denoting the end of the audio work, the DSP 26 notifies the central controller 30 so that the corresponding portion of the audio work in the buffer 60 may be tagged as being the end portion of the audio work. If the data from the buffer 60 does not represent the end of the audio work (box 260), the next set of data is read from the buffer 60 (box 270). The process then loops back to check the fill status of long term memory 50 (box 240) and continues transferring the data from the buffer 60 to long term memory 50 as appropriate.

The process of transferring from the input to the long term memory 50 via the DSP 26 and the buffer 60 should continue until the end of the audio work, or until the user otherwise terminates the action. Typically, the central controller 30 continues reading the buffer 60, and transferring to long term memory 50, until the end of the audio work in the buffer 60 is reached (box 260). The central controller 30 notes the end address of the audio work in long term memory 50 (box 280) and preferably notes the running time of the audio work. Thereafter, the central controller 30 may optionally ask the user to assign an identity to the audio work (box 290), such as by entry of a number on the keypad 34, or by voice identification, or by any other method known in the art. For some embodiments, the central controller 30 not only tracks the memory locations, but also other references for the audio work as appropriate such as the total playing time, the identity tag of the audio work, time/date recorded, and the like. In this manner, data representing the entire audio work, or at least an initial portion thereof, may be recorded in long term memory 50. Once the data is in the long term memory 50, the data is maintained until the user causes it to be deleted.

If during this long term recording process, long term memory 50 is full (box 230), the user is alerted to the error (box 300) and the long term memory 50 is preferably cleared of the newly added data representing the incomplete audio work (box 310). In addition, it may be desirable to prompt the user at this time to delete some of the audio works earlier stored in long term memory 50 so as to free up long term memory 50 space. The same or similar process (boxes 300–310) may also be used if the user terminates the procedure before completion.

At the conclusion of the long term recording sub-process, the audio device 20 loops back to main process at the start of the sound gap detection process (box 110 of FIG. 2) so that the next audio work may be recorded if so desired.

It should be noted that under some circumstances, the buffer 60 may contain portions of multiple audio works. For instance, a first song from a radio 14 may be concluded and the next song begun before the central controller 30 has read all of the buffer 60. In such circumstances, the central controller 30 and the DSP 26 should coordinate their activities so that no data is lost. Obviously, it is desirable for the reading of the buffer 60 and transferring to long term memory 50 to occur at a faster rate than the DSP 26 is sending data to the buffer 60 to avoid over-filling the buffer 60.

In the discussion above, a sound gap of no sound or voice-only was used as the delimiter between musical audio works. However, this is not required in all instances. Indeed, for voice based audio works, the roles of music and voice may be switched. Alternatively, the process may initially note the type of audio work, setting indicator flags as appropriate, and thereafter treat changes to audio work type as sound gap delimiters. Such changes in audio work type may be identified as discussed above, or any other of a wide variety of known techniques may be used to identify changes in the type of the audio work received from the audio source 10.

While the recording device 20 may record various types of audio works, some embodiments of the invention may selectively disable recording of non-musical audio works to save space in long term memory 50 and/or apply a different compression algorithm to non-musical audio works. For instance, the DSP 26 may apply a different compression routine to voice works if appropriate, such as to allow an effective playback rate of 8 kbits/second, instead of a compression rate that allows for an effective playback rate of 128 kbits/sec for music.

The audio works stored in long term memory 50 may be replayed by essentially reversing the process above. The appropriate data may be retrieved from long term memory 50 by the central controller 30 and fed to the buffer 60. The DSP 26 can then read the data from the buffer 60, decompress it, and output the resulting audio signal to the speaker 40. The fetching process from long term memory 50 would likely be in a multiple batch process wherein the central controller 30 monitors the available capacity of the buffer 60 and fetches more data from the long term memory 50 when appropriate. This playback process preferably continues until the audio work has been played in its entirety or until the process is interrupted by the user pressing a "stop" button, or the recording device 20 is otherwise interrupted.

As is clear from the discussion above, multiple audio works may be stored in the long term memory 50. In order to allow the user to select which audio work to play, the various stored audio works are preferably tagged or otherwise associated with identifying information. In some embodiments, the audio works may simply be identified as "song 1," song 2," or the like. In other embodiments, the central controller 30 may prompt the user for a voice identification for the audio work during or upon completion of the recording process. For instance, the user may be prompted to supply to supply a title, such as "Jingle Bells," for the work. Thereafter, the central controller 30 may identify that particular audio work to the user by playing back the user's own voice identification. Alternatively, the user's voice identification may also be used for voice activation of the playback, such as by the user saying "play Jingle Bells," or the like. The details of voice activation are well known, and a fuller explanation thereof is unnecessary to understand or practice the present invention.

Because multiple audio works may be stored in long term memory 50, along with whatever other operating data may be stored in long term memory 50, it is possible that the long term memory 50 may become full. The controller preferably monitors the capacity state of the long term memory 50 and if a full condition exists or is imminent, the user is should be prompted to delete some or all of the audio works from long term memory 50. To facilitate this, appropriate information regarding the audio works currently stored in long term memory 50 may be displayed on the display 36 or otherwise communicated to the user.

The discussion above has assumed that the input of the audio signal to the recording device 20, upstream of the DSP 26, is analog in nature, but this is not required. Indeed, the input of the audio signal may in digital form and may be made directly to the DSP 26, or through the central controller 30, without departing from the scope of the invention.

In addition, the recording device 20 may be configured to optionally allow the playback of audio works not originally recorded by the recording device 20. For instance, long term memory 50 may include a removable micro-memory card that includes compressed data versions of one or more audio works that were recorded elsewhere. This data could be converted into audible sounds in the same manner as data originally recorded by the recording device 20 itself. Alternatively, similar data may be provided by an external device via the USB port 38. In this or a similar manner, pre-recorded audio works can be optionally played by the recording device 20.

Further, the examples above have monitored the capacity status of the buffer 60 to prevent over-flow of the buffer 60. Such buffer status may be achieved in numerous ways, either directly or indirectly, such as through the use of a timer 28 triggered by the DSP 20 at the start of an audio work. Of course, such a check of the buffer 60 is not absolutely required, but good design practices would include such a safeguard.

In addition, the recording device 20 may also perform other functions. For instance, the recording device may optionally include a transceiver 70 suitable for bi-directional wireless telecommunications, such as cellular telephony or satellite communications. Preferably, such a transceiver 70 operates in conjunction with the central controller 30 to selectively participate in a cellular communications system operating under any standard well known in the art, such as AMPS, D-AMPS, GSM, and the like. In addition, while the recording device 20 may be relatively fixed in its environment, the present invention is particularly adapted for small portable recording devices 20, whether multi-function or not.

The present invention may, of course, be carried out in other specific ways than those herein set forth without departing from the spirit and essential characteristics of the invention. The present embodiments are, therefore, to be considered in all respects as illustrative and not restrictive, and all changes coming within the meaning and equivalency range of the appended claims are intended to be embraced therein.

What is claimed is:

1. A method of recording an audio work received from an audio source at a recording device, comprising:
    a) detecting, at the recording device, the beginning of the audio work;
    b) thereafter, automatically buffering an initial portion of the audio work in a short term memory buffer associated with said recording device;
    c) after the start of said buffering and in response to a user activation command, recording at least a portion of said audio work buffered in said short term memory buffer, including said initial portion, in long term memory associated with said recording device.

2. The method of claim 1 wherein said buffering includes stream compressing at least the initial portion of the audio work.

3. The method of claim 1 wherein said short term memory is flushed if the user fails to give a record command before the expiration of a predetermined time after said detection of the beginning of the audio work.

4. The method of claim 1 wherein said short term memory is flushed if the user fails to give a record command before the said short term memory buffer is filled with said audio work.

5. The method of claim 1 wherein said recording includes storing data representative of a compressed version of the audio work in long term memory.

6. The method of claim 1 wherein said recording device includes a radio receiver and wherein said audio work is received from the audio source via said radio receiver.

7. The method of claim 1 wherein said audio source includes a compact disc player and wherein said audio work is an audio work played by said compact disc player.

8. The method of claim 1 wherein said long term memory is a memory module selectively removable from the audio device.

9. The method of claim 1 further including thereafter creating an audio output through at least one speaker associated with said recording device based on said audio work stored in said long term memory.

10. The method of claim 1 wherein said initial portion of said audio work is of at least 20 seconds of duration.

11. A method of recording an audio work received from an audio source at a recording device, comprising:
    a) detecting, at the recording device, the beginning of the audio work;
    b) thereafter, automatically buffering at least an initial portion of the audio work in a short term memory buffer associated with said recording device; said buffering including stream compressing the initial portion of the audio work according to a perceptual coding technique and storing the compressed version of said initial portion of the audio work in said short term memory buffer;
    c) after the start of said buffering, either
        i) recording a compressed version of said audio work, including at least said initial portion, in long term memory associated with said recording device in response to a record command so that the entire audio work may be recorded in long term memory if so desired by the user; or
        ii) removing said audio work from said short term memory buffer if the user fails to give the user activation command before said short term memory buffer is filled by said audio work.

12. The method of claim 11 wherein said recording device includes a radio receiver and wherein said audio work is received from the audio source via said radio receiver.

13. The method of claim 11 wherein said audio source includes a compact disc player and wherein said audio work is an audio work played by said compact disc player.

14. The method of claim 11 further including detecting the beginning of a second audio work and thereafter automatically stream compressing the initial portion of said second audio work and storing the compressed version of said initial portion of said second audio work in said short term memory.

15. The method of claim 11 wherein said perceptual coding technique is according to MPEG layer-3 audio coding.

16. The method of claim 15 wherein said compression is by a factor of at least 12.

17. A recording device for recording an audio work received from an audio source, comprising:
- a) means for identifying the beginning of an audio work based on input signals representing the audio work received from the audio source;
- b) a short term memory buffer;
- c) means for stream compressing at least the initial portion of a first audio work to form compressed data;
- d) means for loading said compressed data into said short term memory buffer;
- e) a central controller in communication with said means for identifying the beginning of an audio work;
- f) long term memory in communication with said central controller;
- g) wherein said compressed data in said short term memory buffer is discarded without being stored in said long term memory if the short term memory buffer is filled by said compressed data before the receipt of a record command; and
- h) wherein said compressed data in said short term memory buffer is transferred to said long term memory to form a representation of the audio work in said long term memory, including at least the initial portion of the audio work, in response to a record command received before said compressed data fills said short term memory buffer.

18. The recording device of claim 17 further including a transceiver in communication with said central controller and jointly selectively operable to send and receive signals in a wireless communications telecommunications system.

* * * * *